United States Patent
Sun et al.

(10) Patent No.: US 8,766,735 B2
(45) Date of Patent: Jul. 1, 2014

(54) LOW POWER VOLTAGE CONTROLLED OSCILLATOR

(71) Applicant: International Business Machines Corporation, Armonk, NY (US)

(72) Inventors: Pinping Sun, Essex Junction, VT (US); Chengwen Pei, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 13/681,446

(22) Filed: Nov. 20, 2012

(65) Prior Publication Data

US 2014/0139295 A1    May 22, 2014

(51) Int. Cl.
*H03B 5/12* (2006.01)
(52) U.S. Cl.
CPC ............ *H03B 5/1212* (2013.01); *H03B 5/1228* (2013.01); *H03B 5/124* (2013.01)
USPC ....................... 331/117 FE; 331/115; 331/185
(58) Field of Classification Search
CPC .......... H03B 5/08; H03B 5/12; H03B 5/1206; H03B 5/1212; H03B 5/1215; H03B 5/1228; H03B 5/124; H03B 5/1243; H03B 5/1246; H03B 5/18; H03B 5/1864; H03B 5/187
USPC .......... 331/108 A, 108 R, 113 R, 115, 117 D, 331/117 FE, 117 R, 167, 185
See application file for complete search history.

(56) References Cited

U.S. PATENT DOCUMENTS

| 7,145,409 | B2 * | 12/2006 | Lee et al. | 331/117 FE |
| 7,545,230 | B2 * | 6/2009 | Jang et al. | 331/177 V |
| 7,589,598 | B2 * | 9/2009 | Jang et al. | 331/49 |
| 8,035,456 | B1 * | 10/2011 | Jang et al. | 331/117 FE |
| 8,514,028 | B2 * | 8/2013 | Ding et al. | 331/117 FE |

OTHER PUBLICATIONS

Jang, S.L. et al., "A low voltage and power LC VCO implemented with dynamic threshold voltage MOSFETs" IEEE Microwave and Wireless Components Letter (May 2007) pp. 376-378, vol. 17, No. 5.
Yang, C.Y. et al., "A 0.6 V 10 GHz CMOS VCO Using a Negative-Gm Back-Gate Tuned Technique" IEEE Microwave and Wireless Components Letters (Mar. 2011) pp. 163-165, vol. 21, No. 3.

(Continued)

*Primary Examiner* — Levi Gannon
(74) *Attorney, Agent, or Firm* — Scully, Scott, Murphy & Presser, P.C.; H. Daniel Schnurmann (57) ABSTRACT

An enhanced negative resistance voltage controlled oscillator (VCO) is provided, in which the body of each transistor within a pair of cross-coupled transistors is coupled to the gate of the same transistor through a resistor. The body transconductance is employed to enhance the negative resistance of the cross-coupled pair of transistors. At the same time, a forward body bias voltage reduces the threshold voltage of the cross-coupled pair to allow the VCO to operate at a low power supply voltage. Further, the resistor connected between the body and the drain of each transistor voids the leakage in the substrate, and thus, reduces power consumption of the VCO further. This VCO provides low power operation with enhanced figure of merit without employing any extra inductors besides the inductors that are part of the LC tank.

20 Claims, 11 Drawing Sheets (56) References Cited

OTHER PUBLICATIONS

Luo, T.N. et al., "A Sub-1V Low Power V-Band CMOS VCO With Self-Body-Bias" Proc. IEEE APMC Asia-Pacific Microwave Conference (Dec. 11-14, 2007) pp. 1-4.

Jang, S. et al., "A 0.3 V cross-coupled VCO using dynamic threshold MOSFET" IEEE Microwave and Wireless Components Letters (Mar. 2010) pp. 166-168, vol. 20, No. 3.

* cited by examiner

LOW POWER VOLTAGE CONTROLLED OSCILLATOR

BACKGROUND

The present disclosure relates to a semiconductor circuit, and particularly to a voltage controlled oscillator circuit for low power applications.

The rapid growth of wireless communication systems such as global system for mobile communications (GSM), CDMA (code division multiple access), WCDMA (wideband code division multiple access), and 802.11a/b/g has driven the proliferation of high performance functional blocks to be integrated into low cost complementary metal oxide semiconductor (CMOS) devices. In multi-gigahertz range wireless communication, the communication bandwidth is heavily dependent on the quality of the signal source or frequency synthesizer that includes a voltage controlled oscillator (VCO).

The ever increasing requirement for the bandwidth places very stringent requirements on the design of a VCD in terms of frequency, power consumption, and noise level. At the same time, the next generation of communication chips will be integrated into a low cost deep submicron process. This means that the supply voltage for a VCO needs to be reduced with the ongoing scaling of CMOS devices. Thus, the next generation data signal modulator (DSM) design is expected to provide a reduced power supply voltage without phase noise degradation.

Usually, a complementary local oscillator (LO) VCO design is preferred by designers because of low phase noise and low power consumption. The disadvantage of the complementary LO VCO is high voltage headroom. Novel technology to simultaneously address low phase noise, low power consumption, and low voltage headroom is thus desired.

BRIEF SUMMARY

An enhanced negative resistance voltage controlled oscillator (VCO) circuit is provided, in which the body of each transistor within a pair of cross-coupled transistors is coupled to the drain of the same transistor through a resistor. A body transconductance is employed to enhance the negative resistance of the cross-coupled pair of transistors. At the same time, a forward body bias voltage reduces the threshold voltage of the cross-coupled pair to allow the VCO to operate at a low power supply voltage. Further, the resistor connected between the body and the drain of each transistor voids the leakage in the substrate, and thus, reduces power consumption of the VCO further. The VCO circuit of the present disclosure provides low power operation with enhanced figure of merit without employing any extra inductor besides the inductors that consist of the LC tank.

According to an aspect of the present disclosure, a voltage controlled oscillator (VCO) circuit is provided. The VCO circuit includes a pair of cross-coupled transistors that contains a first transistor and a second transistor that are located on a substrate. A first gate of the first transistor is electrically shorted to a second drain of the second transistor, and a second gate of the second transistor is electrically shorted to a first drain of the first transistor. The VCO circuit further includes a first resistor electrically shorted to the first gate and a first body of the first transistor, and a second resistor electrically shorted to the second gate and a second body of the second transistor.

DETAILED DESCRIPTION

As stated above, the present disclosure relates to a voltage controlled oscillator circuit for low power applications. Aspects of the present disclosure are now described in detail with accompanying figures. Like and corresponding elements mentioned herein and illustrated in the drawings are referred to by like reference numerals. The drawings are not necessarily drawn to scale.

As used herein, a "circuit" refers to a set of devices that provides at least one current path between a power supply device and electrical ground. As used herein, a voltage controlled oscillator refers to an electronic oscillator designed to be controlled in oscillation frequency by a voltage input.

Figure 1:
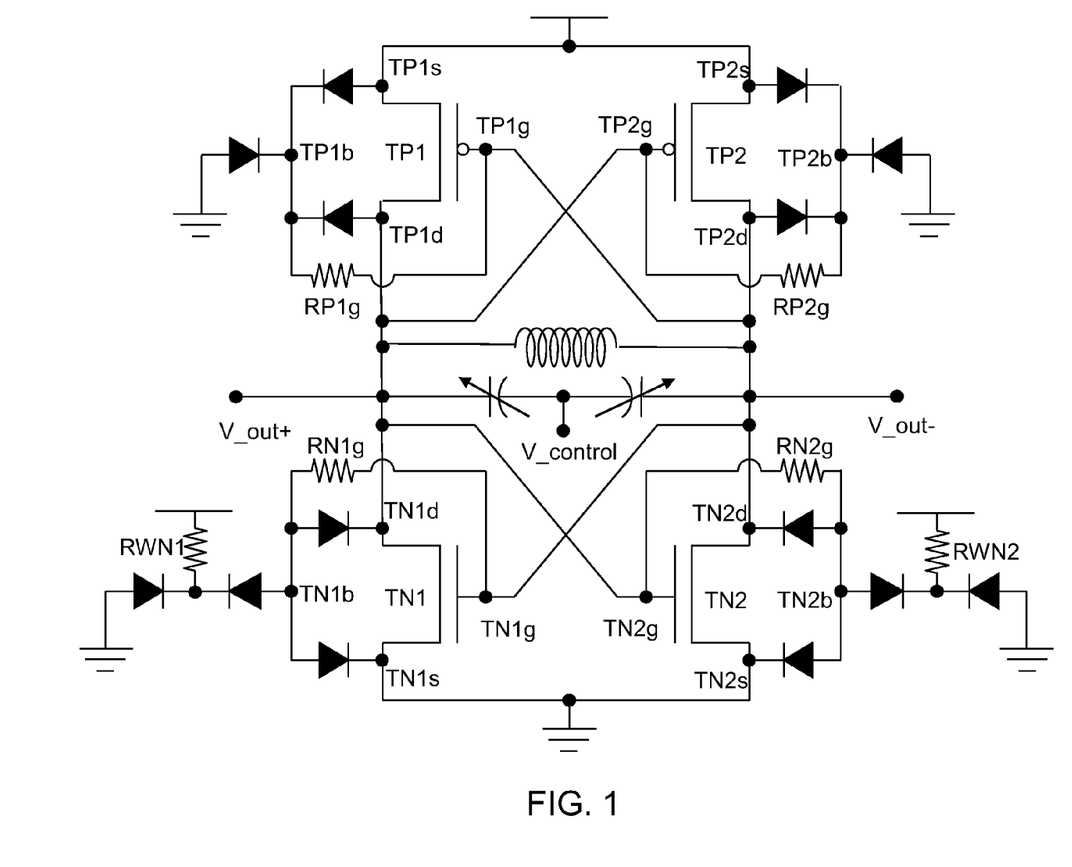
FIG. 1 is a circuit schematic of a first exemplary voltage controlled oscillator (VCO) circuit according to an embodiment of the present disclosure.
Figure 2:
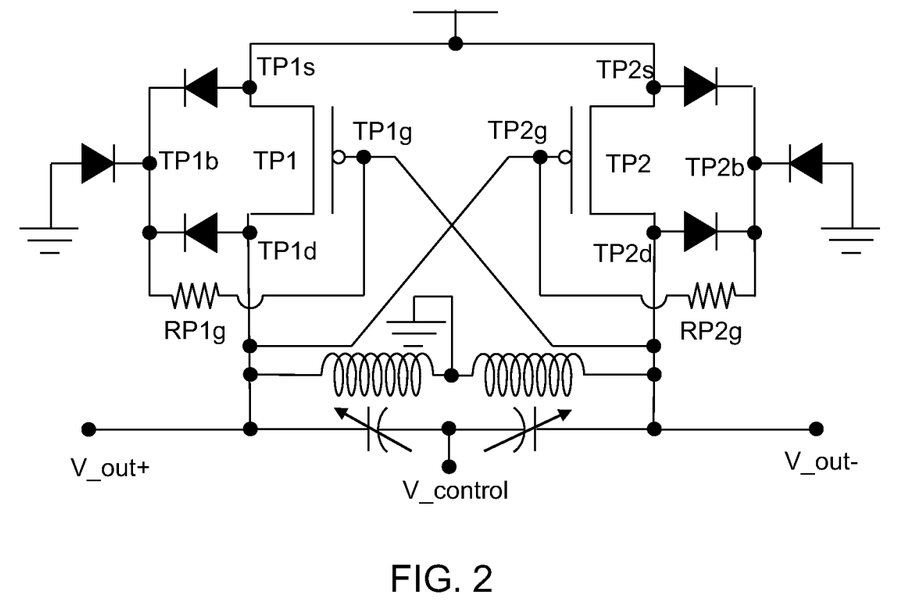
FIG. 2 is a circuit schematic of a second exemplary VCO circuit according to an embodiment of the present disclosure.
Figure 3:
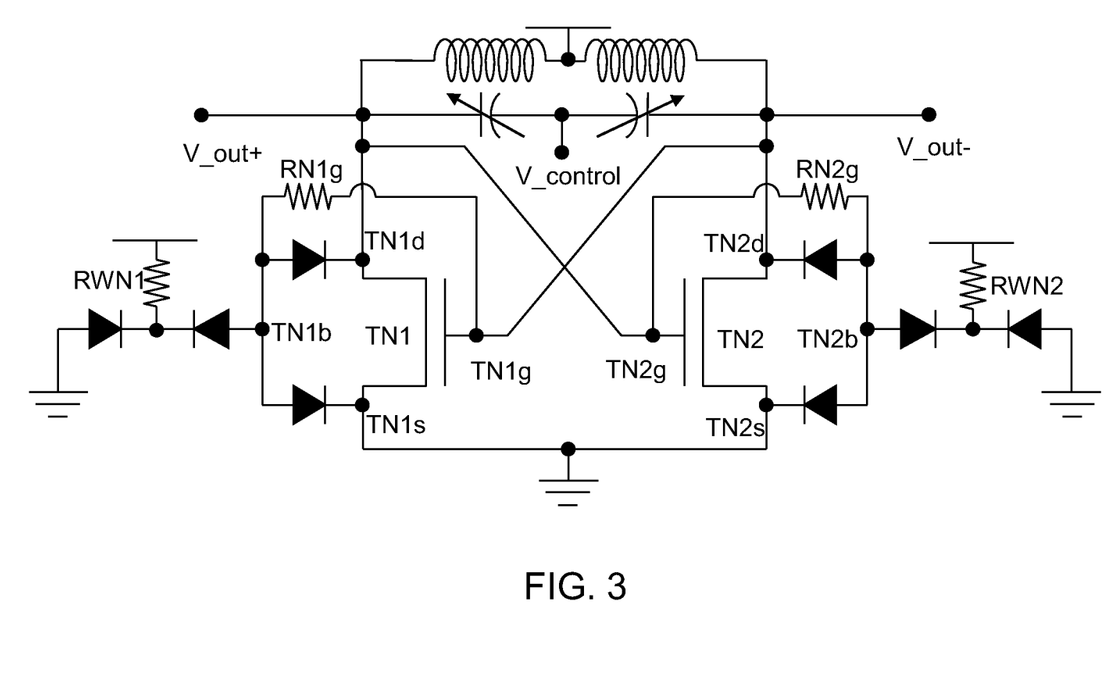
FIG. 3 is a circuit schematic of a third exemplary VCO circuit according to an embodiment of the present disclosure.

Referring to FIGS. 1, 2, and 3, a first exemplary voltage controlled oscillator (VCO) circuit, a second exemplary VCO circuit, and a third exemplary VCO circuit according to embodiments of the present disclosure are illustrated in circuit schematics. Each of the first, second, and third exemplary VCO circuits includes a pair of cross-coupled transistors including a first transistor and a second transistor that are located on a substrate. A gate (which is herein referred to as a first gate) of the first transistor is electrically shorted to a drain (which is herein referred to as a second drain) of the second transistor. A gate (which is herein referred to as a second gate) of the second transistor is electrically shorted to a drain (which is herein referred to as a first drain) of the first transistor. As used herein, a first element is electrically shorted to a second element if the only resistance between the first element and the second is a parasitic resistance, which is typically less than 5 Ohms, and can be less than 1 Ohm, and can be based on the layout design.

In an upper portion of the circuit schematic for the first exemplary VCO circuit and in the circuit schematic of the second exemplary VCO circuit, a first p-type field effect transistor labeled "TP1" can correspond to the first transistor, and a second p-type field effect transistor labeled "TP2" can correspond to the second transistor. In this case, the node labeled "TP1g" corresponds to the first gate, and the node labeled "TP2g" corresponds to the second gate. The node labeled "TP1d" corresponds to the first drain, and the node labeled "TP2d" corresponds to the second drain.

Alternately, in a lower portion of the circuit schematic for the first exemplary VCO circuit and in the circuit schematic of the third exemplary VCO circuit, a first n-type field effect transistor labeled "TN1" can correspond to the first transistor, and a second n-type field effect transistor labeled "TN2" can correspond to the second transistor. In this case, the node labeled "TN1g" corresponds to the first gate, and the node labeled "TN2g" corresponds to the second gate. The node labeled "TN1d" corresponds to the first drain, and the node labeled "TN2d" corresponds to the second drain.

A first resistor is electrically shorted to the first gate and a body (which is herein referred to as a first body) of the first transistor. A second resistor is electrically shorted to the second gate and a body (which is herein referred to as a second body) of the second transistor.

In the upper portion of the circuit schematic for the first exemplary VCO circuit and in the circuit schematic of the second exemplary VCO circuit, a resistor labeled "RP1g" can correspond to the first resistor, and a resistor labeled "RP2g" can correspond to the second resistor. In this case, the node labeled "TP1b" corresponds to the first body, and the node labeled "TP2b" corresponds to the second body.

Alternately, in the lower portion of the circuit schematic for the first exemplary VCO circuit and in the circuit schematic of the third exemplary VCO circuit, a resistor labeled "RN1g" can correspond to the first resistor, and a resistor labeled "RN2g" can correspond to the second resistor. In this case, the node labeled "TN1b" corresponds to the first body, and the node labeled "TN2b" corresponds to the second body.

A source (which is herein referred to as a first source) of the first transistor and a source (which is herein referred to as a second source) of the second transistor are electrically shorted to each other. The first source and the second source can be electrically shorted to either a power supply source or to electrical ground.

In the upper portion of the circuit schematic for the first exemplary VCO circuit and in the circuit schematic of the second exemplary VCO circuit, a node labeled "TP1s" can correspond to the first source, and a node labeled "TP2s" can correspond to the second source. In this case, the first source and the second source are electrically shorted to the power supply source represented by a power supply node symbol.

Alternately, in the lower portion of the circuit schematic for the first exemplary VCO circuit and in the circuit schematic of the third exemplary VCO circuit, a node labeled "TN1s" can correspond to the first source, and a node labeled "TN2s" can correspond to the second source. In this case, the first source and the second source are electrically shorted to electrical ground.

In one embodiment, the first transistor and the second transistor can be substantially matched, i.e., have substantially the same device parameters in terms of the electrical current between the source and the drain as a function of the drain-to-source voltage and as a function of the gate-to-source voltage. In one embodiment, the first and second transistors can have the same physical channel length, the same channel width, the same dopant profile in the body regions embodying the body nodes, the source regions embodying the source nodes, and the drain regions embodying the drain nodes. As used herein, two devices are substantially matched if the differences in the device characteristics of the two devices are within variations encountered during normal semiconductor manufacturing processes for an identical device.

Further, the first resistor and the second resistor can also be matched. In this case, the first resistor and the second resistor can have substantially the same resistance. In one embodiment, the first resistor and the second resistor can be embodied as a pair of physical structures having substantially the same resistivity, substantially the same width, and substantially the same length. As used herein, a pair of resistors has substantially the same resistance if the difference between the resistance values of the two resistors is within variations encountered during normal semiconductor manufacturing processes for an identical resistor.

In one embodiment, the substantially same resistance can have a value selected from a range from 200 Ohms to 20,000 Ohms. In one embodiment, the substantially same resistance can have a value selected from a range from 400 Ohms to 10,000 Ohms. In one embodiment, the substantially same resistance can have a value selected from a range from 1,000 Ohms to 4,000 Ohms.

Figure 4:
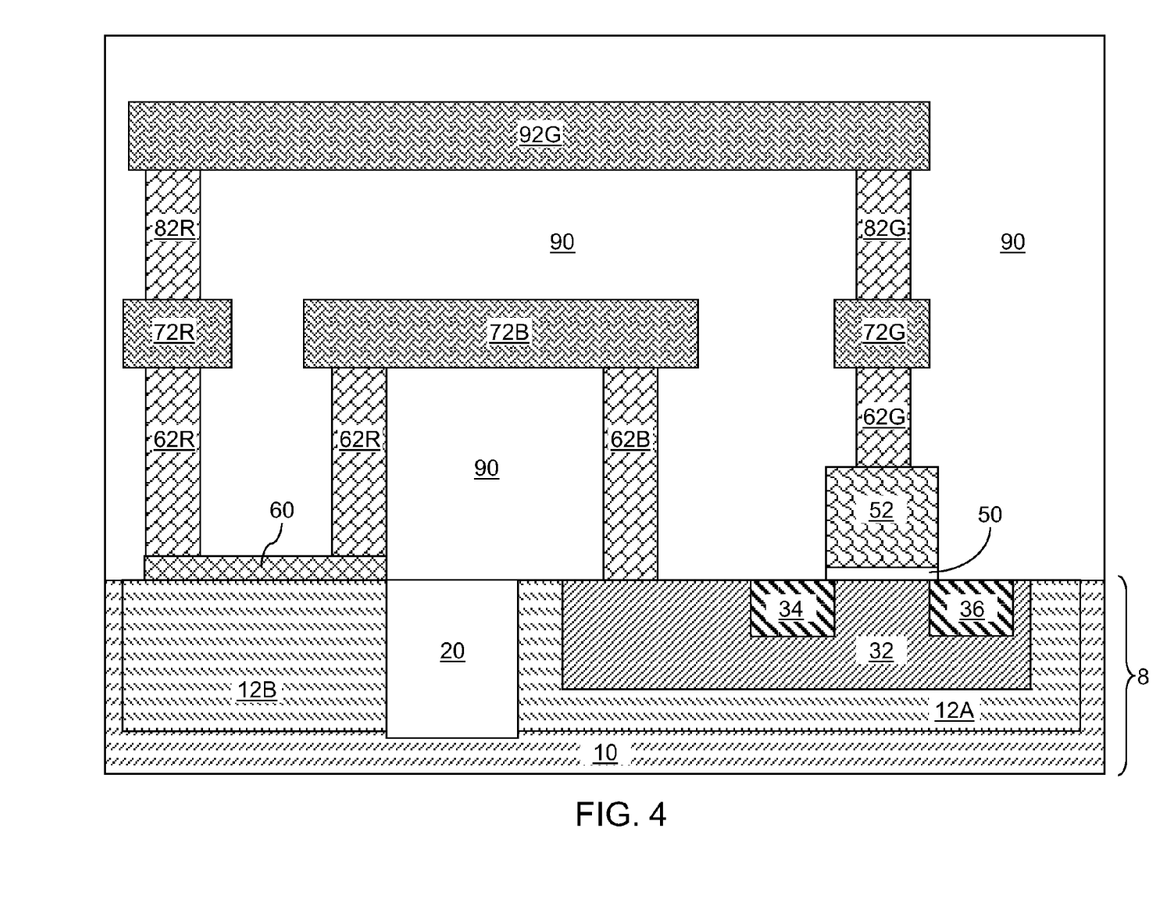
FIG. 4 is a vertical cross-sectional view of a portion of the first, second, or third exemplary VCO circuit that illustrates metal interconnect structures providing an electrical connection among a gate of a transistor, a resistor, and a body of the transistor as embodied employing a triple well configuration.

In one embodiment, each of the first resistor and the second resistor can be located on the same substrate as the first and second transistors, or can be embedded within at least one dielectric material layer located above the substrate. Referring to FIG. 4, a portion of the first, second, or third exemplary VCO circuit including one of the first and second resistors is shown. Specifically, the resistor 60 illustrated in FIG. 4 can be the first resistor or the second resistor. The resistor 60 can be located on the substrate 8 and/or can be embedded within the at least one dielectric material layer 90, which includes a dielectric material such as silicon oxide, silicon nitride, silicon oxynitride, porous or non-porous organosilicate glass, or combinations thereof. The resistor 60 may be located on an embedded doped well 12B having a doping of the second conductivity type with a reverse bias between the semiconductor substrate layer 10 and the embedded doped well 12B, or may be located on a shallow trench isolation structure 20 so as to provide electrical isolation of the resistor 60 from other electronic components.

The substrate 8 is a semiconductor substrate including a doped semiconductor material layer 10 having a doping of a first conductivity type, which can be p-type or n-type. A first doped well 12A having a doping of a second conductivity type is embedded within the doped semiconductor material layer 10. The second conductivity type is the opposite of the first conductivity type. For example, if the first conductivity type is p-type, the second conductivity type is n-type, and vice versa. A second doped well having a doping of the second conductivity type may be optionally provided within the doped semiconductor material layer 10. A doped well 32 having a doping of the first conductivity type is embedded within the first doped well 12A. The doped well 32, the first doped well 12A, and the doped semiconductor material layer 10 collectively provide a triple well structure, which includes two p-n junctions. Each of the doped well 32, the first doped well 12A, and the doped semiconductor material layer 10 is a doped semiconductor region. A first p-n junction is formed between the doped semiconductor material layer 10 and the first doped well 12A, and a second p-n junction is formed between the first doped well 12A and the doped well 32.

The transistor includes a source region 34, a drain region 36, and a body region that is the same as the doped well 32.

The transistor further includes a gate dielectric 50 and a gate electrode 52. The transistor may further include a gate spacer (not shown). A contact structure (not shown) is formed on each of the source region 34 and the drain region 36. If the resistor 60 represents the first resistor, the transistor (34, 36, 32, 50, 52) represents the first transistor. If the resistor 60 represents the second resistor, the (34, 36, 32, 50, 52) represents the second transistor.

At least one first metal interconnect structure embedded within the at least one dielectric material layer 90 provides an electrically conductive path between the first resistor and the first gate illustrated in FIGS. 1, 2, and 3. Further, at least one second metal interconnect structure embedded within the at least one dielectric material layer provides an electrically conductive path between the second resistor and the second gate illustrated in FIGS. 1, 2, and 3.

If the resistor 60 represents the first resistor and the transistor (34, 36, 32, 50, 52) represents the first transistor, a set of metal interconnect structures providing an electrically conductive path between a first node of the first resistor and the first gate (and thereby electrically shorting the first node of the first resistor and the first gate) can be embodied by a set of at least one contact via structure and/or a set of at least one metal line illustrated in FIG. 4. Likewise, if the resistor 60 represents the second resistor and the transistor (34, 36, 32, 50, 52) represents the second transistor, a set of metal interconnect structures providing an electrically conductive path between a first node of the second resistor and the second gate (and thereby electrically shorting the first node of the second resistor and the second gate) can be embodied by a set of at least one contact via structure and/or a set of at least one metal line illustrated in FIG. 4. In a non-limiting illustrative example (as illustrated in FIG. 4), the set of at least one contact via structure can include a first-via-level gate contact via structure 62G, a second-via-level contact via structure 82G, one of first-via-level resistor contact via structures 62R, and a second-via-level contact via structure 82R. The set of at least one metal line can include a first-line-level gate-overlying metal line 72G, a second-line-level metal line 92G, and a first-line-level resistor-overlying metal line 72R. The set of at least one contact via structure and the set of at least one metal line may be replaced with alternate metal interconnect structures provided that an electrically conductive path that electrically shorts the resistor and the gate of the transistor can be provided.

Further, if the resistor 60 represents the first resistor and the transistor (34, 36, 32, 50, 52) represents the first transistor, another set of metal interconnect structures providing an electrically conductive path between a second node of the first resistor and the first body (and thereby electrically shorting the second node of the first resistor and the first body) can be embodied by another set of at least one contact via structure and/or another set of at least one metal line illustrated in FIG. 4. Likewise, if the resistor 60 represents the second resistor and the transistor (34, 36, 32, 50, 52) represents the second transistor, a set of metal interconnect structures providing an electrically conductive path between the second resistor and the second gate (and thereby electrically shorting the second node of the second resistor and the second gate) can be embodied by another set of at least one contact via structure and/or another set of at least one metal line illustrated in FIG. 4. In a non-limiting illustrative example (as illustrated in FIG. 4), the set of at least one contact via structure can include a first-via-level body contact via structure 62B and the other of the first-via-level resistor contact via structures 62R. The set of at least one metal line can include a first-line-level body-to-resistor metal line 72B. The set of at least one contact via structure and the set of at least one metal line may be replaced with alternate metal interconnect structures provided that an electrically conductive path that electrically shorts the resistor and the gate of the corresponding transistor can be provided.

One component among the at least one first metal interconnect structure can be in physical contact with a surface of a doped well including the first body region, and one component among the at least one second metal interconnect structure is in physical contact with a surface of the second body region. For example, the first-via-level body contact via structure 62B can be in physical contact with a surface of the doped well 32 including a body of the transistor (34, 36, 32, 50, 52).

At least one inductor can be electrically shorted to the first drain and to the second drain. The at least one inductor can include a series connection of a first inductor and a second inductor (as illustrated in FIGS. 2 and 3) or a differential inductor (as illustrated in FIG. 1). The first inductor and the second inductor can be substantially matched so as to provide substantially the same inductance.

In an upper portion of the circuit schematic for the first exemplary VCO circuit and in the circuit schematic of the second exemplary VCO circuit, the first p-type field effect transistor labeled "TP1" can correspond to the first transistor, and the second p-type field effect transistor labeled "TP2" can correspond to the second transistor. In this case, the node labeled "TP1$d$" corresponds to the first drain, and the node labeled "TP2$d$" corresponds to the second drain. The series connection of the inductor, the first inductor and the second inductor or the differential inductor is connected across the "TP1$d$" node and the "TP2$d$" node.

Alternately, in a lower portion of the circuit schematic for the first exemplary VCO circuit and in the circuit schematic of the third exemplary VCO circuit, the first n-type field effect transistor labeled "TN1" can correspond to the first transistor, and the second n-type field effect transistor labeled "TN2" can correspond to the second transistor. In this case, the node labeled "TN1$d$" corresponds to the first drain, and the node labeled "TN2$d$" corresponds to the second drain. The series connection of the inductor, the first inductor and the second inductor or the differential inductor is connected across the "TN1$d$" node and the "TN2$d$" node.

In the circuit schematic of the first exemplary VCO circuit of FIG. 1, the node labeled "TP1$s$" can be identified as the first source, and the node labeled "TP2$s$" can be identified as the second source. In this case, the first source and the second source are electrically shorted to the power supply source identified by the power supply node symbol in the circuit schematic. Alternately, the node labeled "TN1$s$" can be identified as the first source, and the node labeled "TN2$s$" can be identified as the second source. In this case, the first source and the second source are electrically shorted to electrical ground.

In the circuit schematic of the second exemplary VCO circuit of FIG. 2, the node labeled "TP1$s$" can be identified as the first source, and the node labeled "TP2$s$" can be identified as the second source. In this case, the first source and the second source are electrically shorted to the power supply source identified by the power supply node symbol in the circuit schematic. The node between the first inductor and the second inductor is electrically shorted to electrical ground.

In the circuit schematic of the third exemplary VCO circuit of FIG. 3, the node labeled "TN1$s$" can be identified as the first source, and the node labeled "TN2$s$" can be identified as the second source. In this case, the first source and the second source are electrically grounded. The node between the first inductor and the second inductor can be electrically shorted to the power supply source identified by the power supply node symbol in the circuit schematic.

At least one capacitor can be electrically shorted to the first drain and to the second drain. The at least one capacitor can include a series connection of a first capacitor and a second capacitor. The first capacitor and the second capacitor can be substantially matched so as to provide substantially the same capacitance. The series connection of the two capacitors (i.e., the first capacitor and the second capacitor) has a first end electrically shorted to the first drain and a second end electrically shorted to the second drain. A voltage control circuit as known in the art can be attached to, i.e., electrically shorted to, a node between the two capacitors, which is labeled as "V_control" node. The voltage control circuit is configured to provide a control voltage to the various VCO circuits of FIGS. 1, 2, and 3 so as to modulate the oscillation frequency of the VCO circuits.

In an upper portion of the circuit schematic for the first exemplary VCO circuit and in the circuit schematic of the second exemplary VCO circuit, the first p-type field effect transistor labeled "TP1" can correspond to the first transistor, and the second p-type field effect transistor labeled "TP2" can correspond to the second transistor. In this case, the node labeled "TP1$d$" corresponds to the first drain, and the node labeled "TP2$d$" corresponds to the second drain. The series connection of the first capacitor and the second capacitor is connected across the "TP1$d$" node and the "TP2$d$" node.

Alternately, in a lower portion of the circuit schematic for the first exemplary VCO circuit and in the circuit schematic of the third exemplary VCO circuit, the first n-type field effect transistor labeled "TN1" can correspond to the first transistor, and the second n-type field effect transistor labeled "TN2" can correspond to the second transistor. In this case, the node labeled "TN1$d$" corresponds to the first drain, and the node labeled "TN2$d$" corresponds to the second drain. The series connection of the first capacitor and the second capacitor is connected across the "TN1$d$" node and the "TN2$d$" node.

The first exemplary VCO circuit of FIG. 1 includes a first pair of cross-coupled transistors and a second pair of cross-coupled transistors. The first pair of cross-coupled transistors can include a first transistor and a second transistor, and the second pair of cross-coupled transistors can include a third transistor and a fourth transistor. A first gate of the first transistor is electrically shorted to second drain of the second transistor. A second gate of the second transistor is electrically shorted to a first drain of the first transistor. A third gate of the third transistor is electrically shorted to a fourth drain of the fourth transistor and the second drain of the second transistor. A fourth gate of the fourth transistor is electrically shorted to a third drain of the third transistor and the first drain of the first transistor. In one embodiment, the first and second transistors can be field effect transistors of a first polarity type, and the third and fourth transistors can be field effect transistors of a second polarity type that is the opposite of the first polarity type.

Further, a first resistor is electrically shorted to the first gate and a first body of the first transistor. A second resistor is electrically shorted to the second gate and a second body of the second transistor. A third resistor is electrically shorted to the third gate and a third body of the third transistor. A fourth resistor is electrically shorted to the fourth gate and a fourth body of the fourth transistor. In one embodiment, the first, second, third, and fourth resistors can have substantially the same resistance, which can be in a range from 200 Ohms to 20,000 Ohms.

In one embodiment, a first p-type field effect transistor labeled "TP1" can be identified as the first transistor, and a second p-type field effect transistor labeled "TP2" can be identified as the second transistor. In this case, the node labeled "TP1$g$" corresponds to the first gate, and the node labeled "TP2$g$" corresponds to the second gate. The node labeled "TP1$d$" corresponds to the first drain, and the node labeled "TP2$d$" corresponds to the second drain. Further, a first n-type field effect transistor labeled "TN1" can be identified as the third transistor, and a second n-type field effect transistor labeled "TP2" can be identified as the fourth transistor. In this case, the node labeled "TN1$g$" corresponds to the third gate, and the node labeled "TN2$g$" corresponds to the fourth gate. The node labeled "TN1$d$" corresponds to the third drain, and the node labeled "TN2$d$" corresponds to the fourth drain. A resistor labeled "RP1$g$" can be identified as the first resistor, and a resistor labeled "RP2$g$" can be identified as the second resistor. The node labeled "TP1$b$" corresponds to the first body, and the node labeled "TP2$b$" corresponds to the second body. Further, a resistor labeled "RN1$g$" can correspond to the third resistor, and a resistor labeled "RN2$g$" can correspond to the fourth resistor. In this case, the node labeled "TN1$b$" corresponds to the third body, and the node labeled "TN2$b$" corresponds to the fourth body.

Alternatively, a first n-type field effect transistor labeled "TN1" can be identified as the first transistor, and a second n-type field effect transistor labeled "TN2" can be identified as the second transistor. In this case, the node labeled "TN1$g$" corresponds to the first gate, and the node labeled "TN2$g$" corresponds to the second gate. The node labeled "TN1$d$" corresponds to the first drain, and the node labeled "TN2$d$" corresponds to the second drain. Further, a first p-type field effect transistor labeled "TP1" can be identified as the third transistor, and a second p-type field effect transistor labeled "TP2" can be identified as the fourth transistor. In this case, the node labeled "TP1$g$" corresponds to the third gate, and the node labeled "TP2$g$" corresponds to the fourth gate. The node labeled "TP1$d$" corresponds to the third drain, and the node labeled "TP2$d$" corresponds to the fourth drain. A resistor labeled "RP1$g$" can be identified as the first resistor, and a resistor labeled "RP2$g$" can be identified as the second resistor. The node labeled "TN1$b$" corresponds to the first body, and the node labeled "TN2$b$" corresponds to the second body. Further, a resistor labeled "RN1$g$" can correspond to the third resistor, and a resistor labeled "RN2$g$" can correspond to the fourth resistor. In this case, the node labeled "TP1$b$" corresponds to the third body, and the node labeled "TP2$b$" corresponds to the fourth body.

In one embodiment, the first and second field effect transistors can be triple well field effect transistors (an example of which is illustrated in FIG. 4). Each of the first body and the second body can be a portion of a first doped well of a first conductivity type such as the doped well 32 in FIG. 4. The first doped well of the first conductivity type can be embedded within a second doped well of a second conductivity type such as the first doped well 12A in FIG. 4. The second doped well of the second conductivity type is embedded within a substrate semiconductor layer having of doping of the first conductivity type such as the substrate semiconductor layer 10 of FIG. 4. The second conductivity type is the opposite of the first conductivity type.

In one embodiment, the first conductivity type can be n-type, and the triple well field effect transistors can be the first n-type field effect transistor TN1 and the second n-type filed effect transistor TN2 in FIGS. 1 and 3. In another embodiment, the first conductivity type can be p-type, and the triple well field effect transistors can be the first p-type field effect transistor TP1 and the second p-type field effect transistor TP2.

If a pair of triple well field effect transistors is employed, a well bias voltage may be applied to the doped well of the second conductivity type, e.g., the first doped well 12A in FIG. 4, through a resistor (such as a first well resistor RWN1 or a second well resistor RWN2) connected between the doped well of the second conductivity type and the power supply node.

The gate operational characteristics of the pair of first and second transistors in the first, and third exemplary VCO circuits can be characterized by a transconductance $g_{m\_n}$ of each n-type transistor, which is defined by:

$$G_{m\_n} = \frac{\partial I_{Dn}}{\partial V_{GSn}}$$

in which $I_{Dn}$ is the source-to-drain current of n-type transistors, $V_{Gsn}$ is the gate-to-source bias voltage of n-type transistor.

In a triple well configuration and in an SOI configuration, the body operational characteristics of the pair of first and second transistors in the first, and third exemplary VCO circuits can be characterized by a body transconductance $g_{mb\_n}$ of each transistor, which is defined by:

$$g_{mb\_n} = \frac{\partial I_{Dn}}{\partial V_{BSn}}$$

in which $I_{Dn}$ is the source-to-drain current of n-type transistor, $V_{BS}$ is the body-to-source bias voltage of n-type transistor.

The gate operational characteristics of the pair of third and fourth transistors in the first and the second exemplary VCO circuits can be characterized by a transconductance $g_{m\_p}$ of each p-type transistor, which is defined by:

$$g_{m\_p} = \frac{\partial I_{Dp}}{\partial V_{GSp}}$$

in which $I_{Dp}$ is the source-to-drain current of p-type transistor, $V_{GSp}$ is the gate-to-source bias voltage of p-type transistor.

In a triple well configuration and in an SOI configuration, the body operational characteristics of the pair of third and fourth transistors in the first, and second exemplary VCO circuits can be characterized by a body transconductance $q_{mb\_p}$ of each transistor, which is defined by:

$$g_{mb\_p} = \frac{\partial I_{Dp}}{\partial V_{BSp}}$$

in which $I_{Dp}$ is the source-to-drain current of n-type transistor, $V_{BSp}$ is the body-to-source bias voltage of n-type transistor.

Within the pair of first and second n-type transistors in the first and third exemplary VCO circuit, the first transistor and the second transistor can be matched such that the first and second transistors have substantially the same values for the transconductance $g_{m\_n}$ and $g_{mb\_n}$. Further, the pair of first and second p-type transistors in the first and second exemplary VCO circuit can be matched such that the third and fourth transistors have substantially the same values for the transconductance $g_{m\_p}$ and $g_{mb\_p}$.

The presence of the resistor RN1g couples the body of the first n-type transistor RN1 to the gate of the same transistor in FIGS. 1 and 3 The presence of the resistor RN2g couples the body of the second n-type transistor RN2 to the gate of the same transistor in FIGS. 1 and 3. The presence of the resistor RP1g couples the body of the first p-type transistor RP1 to the gate of the same transistor in FIGS. 1 and 2. The presence of the resistor RP2g couples the body of the second p-type transistor RP2 to the gate of the same transistor in FIGS. 1 and 2.

The cross-coupled connected transistors TN1, TN2, TP1 and TP2 in the exemplary VCO circuits FIG. 1 generate a negative resistance $R_{pn}$, which is $-2/(g_{m\_n}+g_{mb\_n}+g_{m\_p}+g_{mb\_p})$ and larger than the value of $-2/(g_{m\_n}+g_{m\_p})$ from the design without the presence of the connection of body to gate coupled by RN1g, RN2g, RP1g and RP2g. The cross-coupled connected transistors TP1 and TP2 in the exemplary VCO circuits FIG. 2 generate a negative resistance $R_p$, which is $-2/(g_{m\_p}+g_{mb\_p})$, and larger than the value of $-2/(g_{m\_p})$ from the design without the presence of the connection of body to gate coupled by from RP1g and RP2g. The cross-coupled connected transistors TN1 and TN2 in the exemplary VCO circuits FIG. 3 generate a negative resistance $R_n$, which is $-2/(g_{m\_n}+g_{mb\_n})$, and larger than the value of $-2/(g_{m\_n})$ from the design without the presence of connection of body to gate coupled by RN1g, RN2g. The body transconductance increases the magnitude of the negative resistance of the cross-coupled pair transistors, thereby reducing the current consumption of the first, second, and third exemplary VCO circuits relative alternative VCO circuits. Further, reduction of the current consumption enables reduction of the magnitude of the power supply voltage for the first, second, and third exemplary VCO circuits relative alternative VCO circuits.

In addition, the reduction in the substrate leakage current through use of the triple well configuration (as illustrated in the first and third exemplary VCO circuits and derivable for p-type field effect transistors in the first and second exemplary VCO circuits by employing an n-doped material for a semiconductor substrate layer 10 (See FIG. 4)) enables reduction of the leakage current from the source region 34 or the drain region 36 to the substrate 8.

Each of the first, second, and third exemplary VCO circuits can provide an output voltage at the V_out+ node or at the V_out− node. The output frequency of the exemplary VCO circuits can be modulated by the input voltage applied to the V_control input node.

Figure 5:
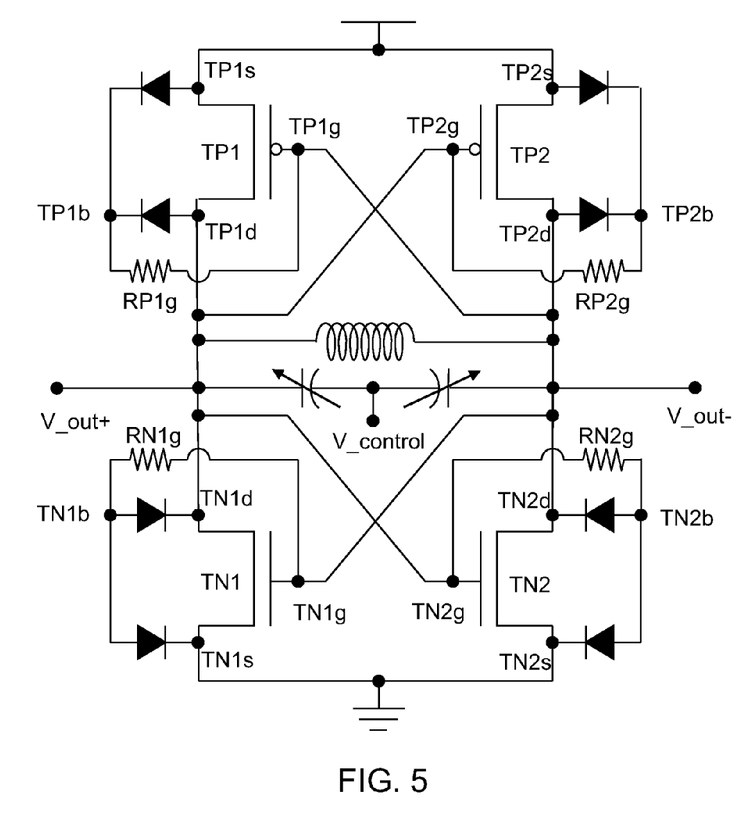
FIG. 5 is a circuit schematic of a fourth exemplary VCO circuit according to an embodiment of the present disclosure.

Referring to FIG. 5, a fourth exemplary VCO circuit according to an embodiment of the present disclosure can be derived from the first exemplary VCO circuit by employing a semiconductor-on-insulator (SOI) substrate for the semiconductor substrate. Each of the first and second p-type field effect transistors (TP1, TP2) in the first exemplary VCO circuit is replaced with a p-type SOI field effect transistor, and each of the first and second n-type field effect transistors (TN1, TN2) that employ a triple well configuration in the first exemplary VCO circuits is replaced with an n-type SOI field effect transistor. In this case, each of the first body and the second body contacts a top surface of a buried insulator layer within the SOI substrate.

Figure 6:
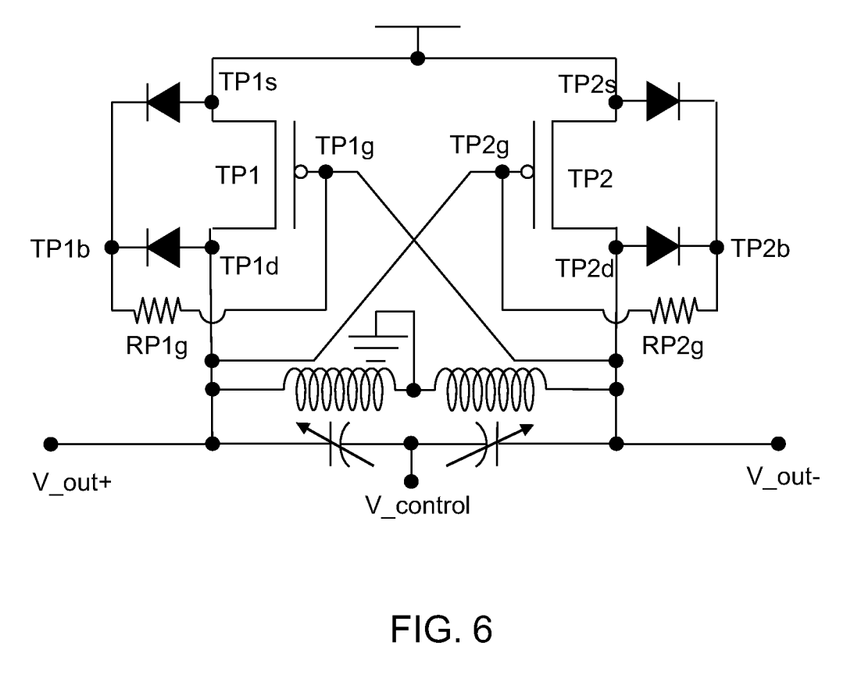
FIG. 6 is a circuit schematic of a fifth exemplary VCO circuit according to an embodiment of the present disclosure.

Referring to FIG. 6, a fifth exemplary VCO circuit according to an embodiment of the present disclosure can be derived from the second exemplary VCO circuit by employing a semiconductor-on-insulator (SOI) substrate for the semiconductor substrate. Each of the first and second p-type field effect transistors (TP1, TP2) in the second exemplary VCO circuit is replaced with a p-type SOI field effect transistor. In this case, each of the first body and the second body contacts a top surface of a buried insulator layer within the SOI substrate.

Figure 7:
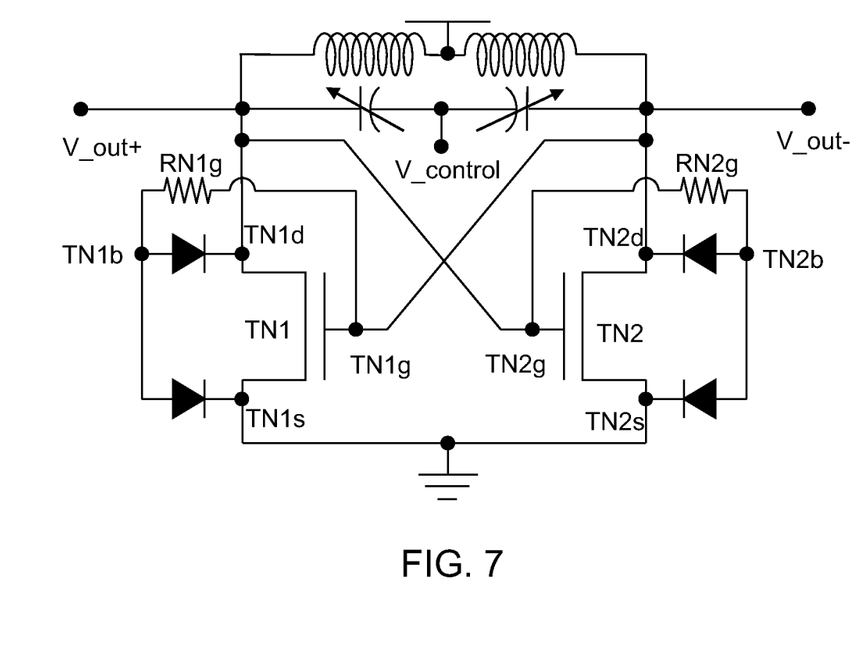
FIG. 7 is a circuit schematic of a sixth exemplary VCO circuit according to an embodiment of the present disclosure.

Referring to FIG. 7, a sixth exemplary VCO circuit according to an embodiment of the present disclosure can be derived from the third exemplary VCO circuit by employing a semiconductor-on-insulator (SOI) substrate for the semiconductor substrate. Each of the first and second n-type field effect transistors (TN1, TN2) that employ a triple well configuration in the first exemplary VCO circuits is replaced with an n-type SOI field effect transistor. In this case, each of the first body and the second body contacts a top surface of a buried insulator layer within the SOI substrate.

Figure 8:
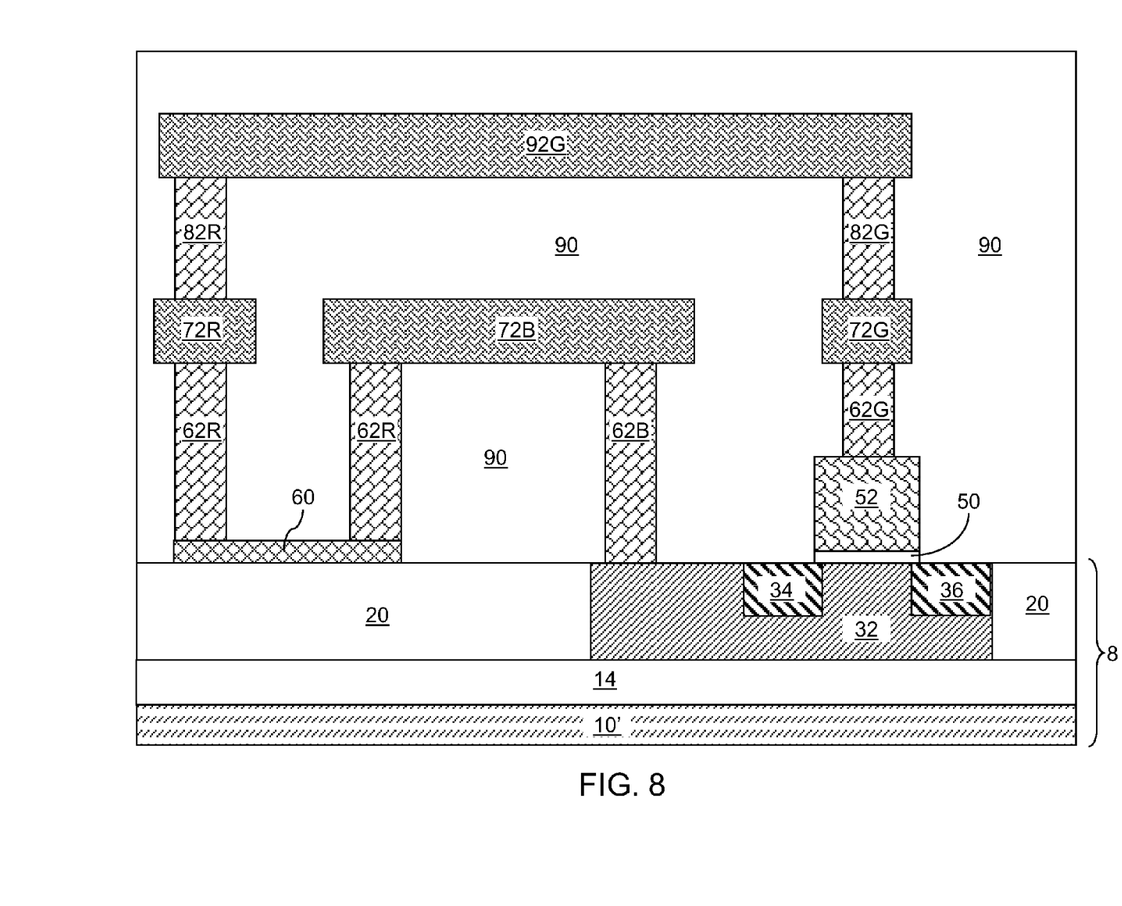
FIG. 8 is a vertical cross-sectional view of a portion of the fourth, fifth, or sixth exemplary VCO circuit that illustrates metal interconnect structures providing an electrical connection among a gate of a transistor, a resistor, and a body of the transistor as embodied in a semiconductor-on-insulator (SOI) configuration.

Referring to FIG. 8, a vertical cross-sectional view of a portion of the fourth, fifth, or sixth exemplary VCO circuit illustrates metal interconnect structures, which provide an electrical connection among a gate of a transistor (34, 36, 32, 50, 52), a resistor 60, and a body of the transistor (34, 36, 32, 50, 52) that is a portion of a doped well 32. The substrate 8 can be a semiconductor on-insulator (SOI) substrate including a handle substrate 10', a buried insulator layer 14, and a top semiconductor layer that includes the doped well 32 (that includes the body of the illustrated transistor), the source region 34, the drain region 36, and shallow trench isolation structures.

Three comparative exemplary VCO circuits are employed herein for comparison with the fourth exemplary VCO circuit. The three comparative exemplary VCO circuits are herein referred to as a first comparative exemplary VCO circuit, a second comparative exemplary VCO circuit, and a third comparative exemplary VCO circuit, respectively. Circuit schematics of the first, second, and third comparative exemplary VCO circuits are shown in FIGS. 9, 10, and 11, respectively.

Figure 9:
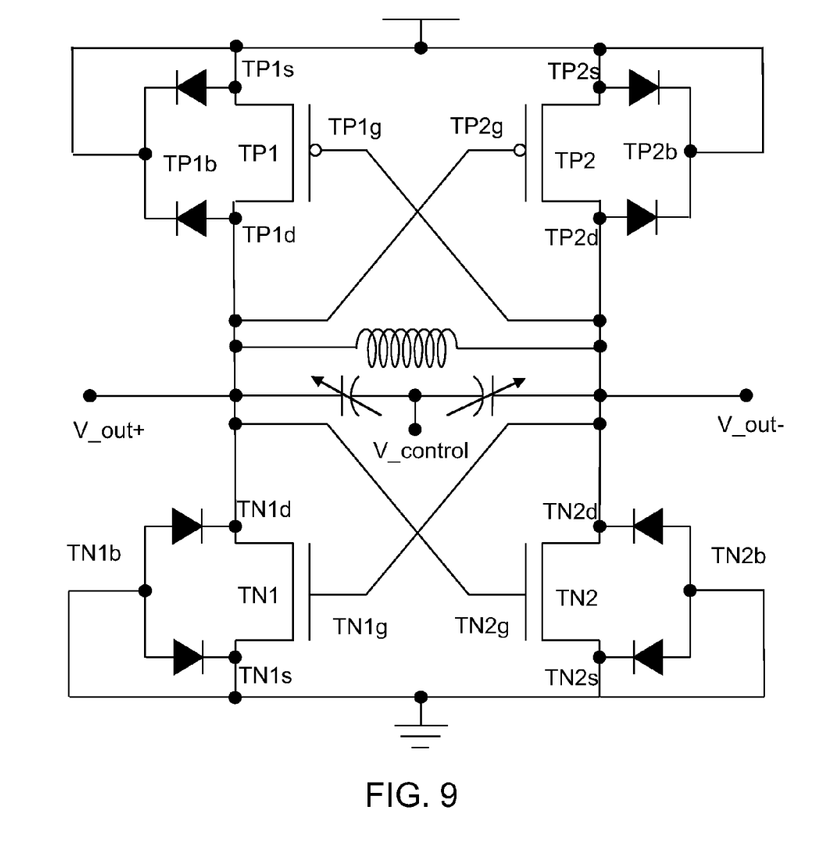
FIG. 9 is a circuit schematic of a first comparative exemplary VCO circuit.

The first comparative exemplary VCO circuit of FIG. 9 employs electrical shorts between the source and the body of each transistor. The second comparative exemplary VCO circuit of FIG. 10 employs a resistor biasing networks shorted to the body. The third comparative exemplary VCO circuit of FIG. 11 employs electrical shorts between the source and the body of each transistor, and a voltage divider including a resistor and a capacitor across the drain node and the source node of each transistor such that the node between the resistor and the capacitor is electrically shorted to the body of the transistor. A comparison of performance parameters of the third exemplary VCO circuit relative to corresponding performance parameters for the three comparative exemplary VCO circuits is shown in Table 1.

Table 1. Performance parameter comparison among the third exemplary VCO circuit and the first, second, and third comparative exemplary VCO circuit.

Figure 10:
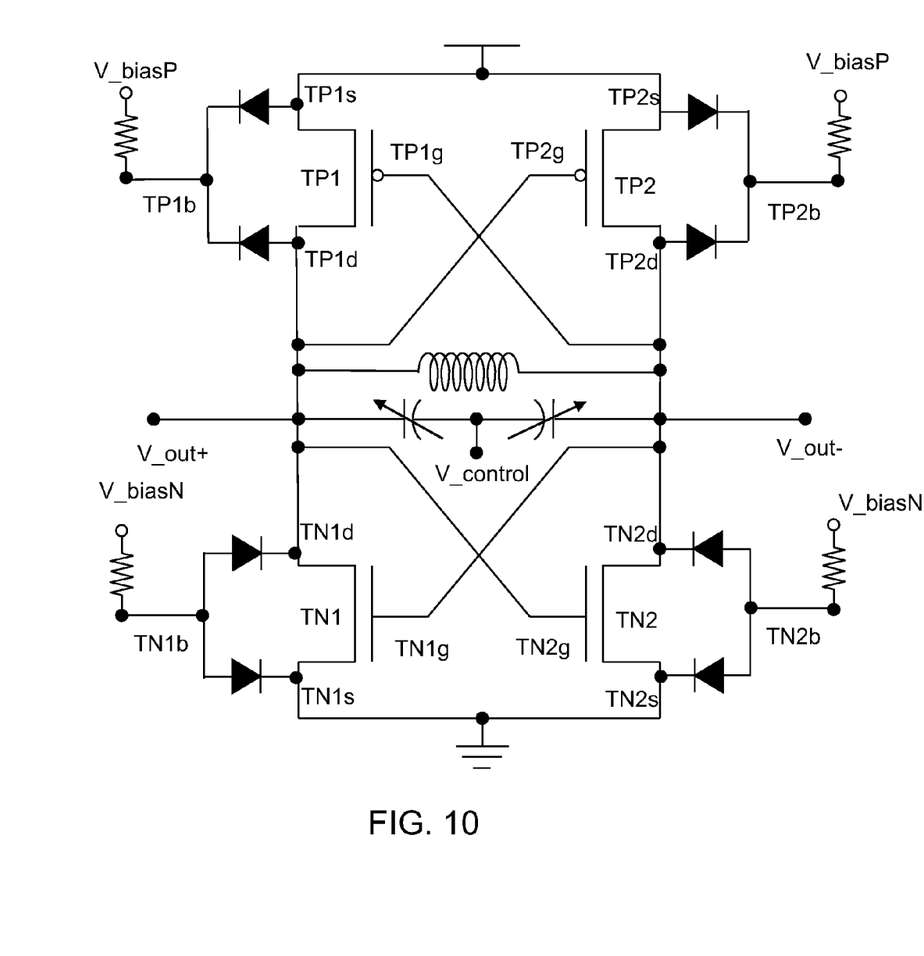
FIG. 10 is a circuit schematic of a second comparative exemplary VCO circuit.
Figure 11:
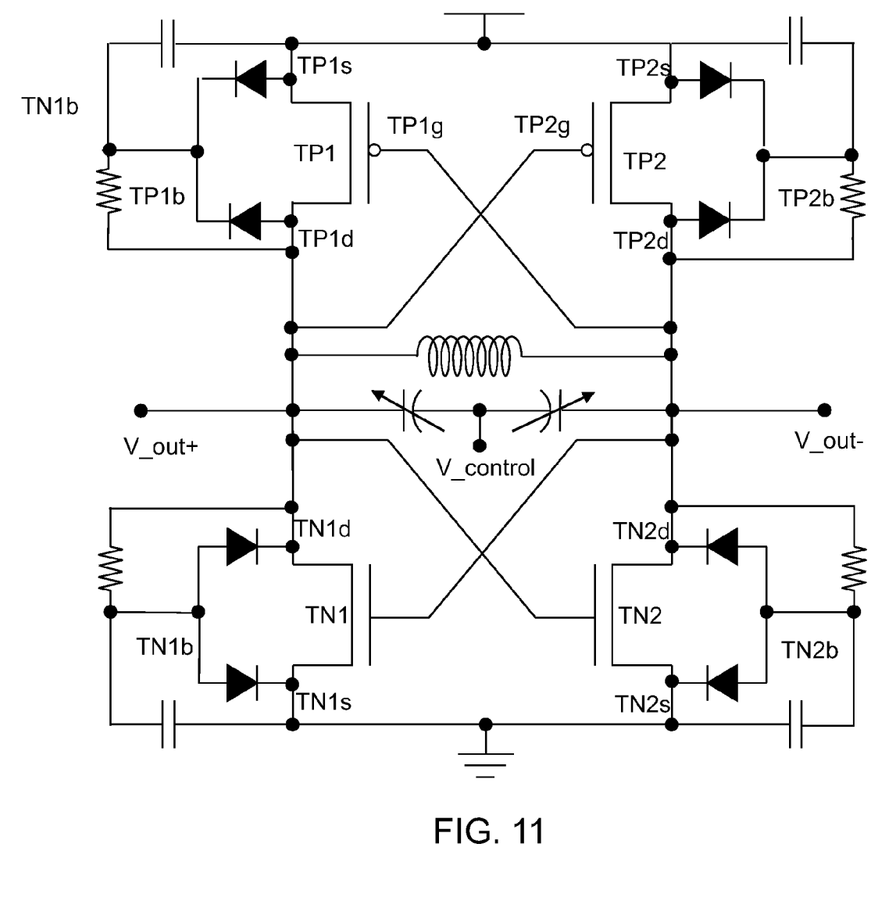
FIG. 11 is a circuit schematic of a third comparative exemplary VCO circuit.

|  | The first comparative exemplary VCO circuit of FIG. 9 | The second comparative exemplary VCO circuit of FIG. 10 | The third comparative exemplary VCO circuit of FIG. 11 | The fourth exemplary VCO circuit of FIG. 5 |
| --- | --- | --- | --- | --- |
| Channel length (nm) | 32 | 32 | 32 | 32 |
| Nominal oscillation frequency $f_0$ (GHz) | 30.4 | 30.59 | 30.69 | 30.57 |
| Power Supply Voltage (V) | 0.6 | 0.5 | 0.6 | 0.5 |
| Current Consumption (mA) | 3.675 | 2.03 | 4.7 | 0.864 |
| Phase Noise @ 1 MHz (dbc/Hz) | 91.9 | 91.3 | 91 | 91.5 |
| Figure of merit (FOM) | 178.12 | 180.9 | 176.3 | 184.84 |

In Table 1, the figure of merit (FOM) is defined by:

$$FOM = 10\log\left(\left(\frac{f_0}{\Delta f}\right)^2 \frac{1}{P[mW]}\right) - L\{\Delta f\}$$

in which $f_0$ is the nominal oscillation frequency, $\Delta f$ is the absolute value of the difference between an oscillation frequency and the nominal oscillation frequency, $L\{\Delta f\}$ is the phase noise at $\Delta f$ MHz, and $P[mW]$ is the power consumption in units of mW.

As evidenced in Table 1, the fourth exemplary VCO circuit consumes less power than comparative exemplary VCO circuits while generating a comparable level of phase noise. Thus, the fourth exemplary VCO circuit has a greater figure of merit than the comparative exemplary VCO circuits. The first, second, third, fifth, and sixth exemplary VCO circuits can provide similar performance enhancement over VCO circuits that do not employ a resistive connection between the gate and the body of transistors.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A voltage controlled oscillator (VCO) circuit comprising:
    a pair of cross-coupled transistors including a first transistor and a second transistor that are located on a substrate, wherein a first gate of said first transistor is electrically shorted to a second drain of said second transistor, and a second gate of said second transistor is electrically shorted to a first drain of said first transistor;
    a first resistor electrically shorted to said first gate and a first body of said first transistor; and
    a second resistor electrically shorted to said second gate and a second body of said second transistor.

2. The VCO circuit of claim 1, wherein a first source of said first transistor and a second source of said second transistor are electrically shorted to each other.

3. The VCO circuit of claim 2, wherein said first source and said second source are electrically shorted to a power supply source or to electrical ground.

4. The VCO circuit of claim 1, wherein said first resistor and said second resistor have a substantially same resistance.

5. The VCO circuit of claim 4, wherein said substantially same resistance has a value selected from a range from 200 Ohms to 20,000 Ohms.

6. The VCO circuit of claim 1, wherein each of said first resistor and said second resistor is located on said substrate or embedded within at least one dielectric material layer located above said substrate.

7. The VCO circuit of claim 6, further comprising:
at least one first metal interconnect structure embedded within said at least one dielectric material layer and providing an electrically conductive path between said first resistor and said first gate; and
at least one second metal interconnect structure embedded within said at least one dielectric material layer and providing an electrically conductive path between said second resistor and said second gate.

8. The VCO circuit of claim 7, wherein one component among said at least one first metal interconnect structure is in physical contact with a surface of a doped well including said first body region, and one component among said at least one second metal interconnect structure is in physical contact with a surface of said second body region.

9. The VCO circuit of claim 1, further comprising at least one inductor electrically shorted to said first drain and to said second drain.

10. The VCO circuit of claim 9, wherein said at least one inductor includes a series connection of a first inductor and a second inductor or a differential inductor.

11. The VCO circuit of claim 10, wherein said first source and said second source are electrically shorted to a power supply source, and a node between said first inductor and said second inductor or a differential inductor is electrically shorted to electrical ground.

12. The VCO circuit of claim 10, wherein said first source and said second source are electrically shorted to electrical ground, and a node between said first inductor and said second inductor or a differential inductor is electrically shorted to a power supply source.

13. The VCO circuit of claim 1, further comprising a series connection of two capacitors that has a first end electrically shorted to said first drain and a second end electrically shorted to said second drain.

14. The VCO circuit of claim 13, further comprising a voltage control circuit electrically shorted to a node between said two capacitors and configured to provide a control voltage to said node.

15. The VCO circuit of claim 1, wherein said first transistor and said second transistor are n-type field effect transistors, and said first source and said second source are electrically shorted to electrical ground.

16. The VCO circuit of claim 1, wherein said first transistor and said second transistor are p-type field effect transistors, and said first source and said second source are electrically shorted to a power supply source.

17. The VCO circuit of claim 1, further comprising:
a second pair of cross-coupled transistors including a third transistor and a fourth transistor that are located on said substrate, wherein a third gate of said third transistor is electrically shorted to a fourth drain of said fourth transistor and said second drain of said second transistor, and a fourth gate of said fourth transistor is electrically shorted to a third drain of said third transistor and said first drain of said first transistor;
a third resistor electrically shorted to said third gate and a third body of said third transistor; and
a fourth resistor electrically shorted to said fourth gate and a fourth body of said fourth transistor.

18. The VCO circuit of claim 17, wherein said first and second transistors are n-type field effect transistors and said third and fourth transistors are p-type field effect transistors.

19. The VCO circuit of claim 1, wherein said first and second field effect transistors are triple well field effect transistors, and each of said first body and said second body is a portion of a first doped well of a first conductivity type, which is embedded within a second doped well of a second conductivity type, which is embedded within a substrate semiconductor layer having of doping of said first conductivity type, wherein said second conductivity type is the opposite of said first conductivity type.

20. The VCO circuit of claim 1, wherein said first and second field effect transistors are semiconductor-on-insulator (SOI) field effect transistors, and each of said first body and said second body contact a top surface of a buried insulator layer within said substrate.

* * * * *